(12) United States Patent
Ou et al.

(10) Patent No.: US 8,265,917 B1
(45) Date of Patent: Sep. 11, 2012

(54) CO-SIMULATION SYNCHRONIZATION INTERFACE FOR IC MODELING

(75) Inventors: Jingzhao Ou, Sunnyvale, CA (US); Shay Ping Seng, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 513 days.

(21) Appl. No.: 12/036,895

(22) Filed: Feb. 25, 2008

(51) Int. Cl.
*G06F 17/50* (2006.01)
*G06F 9/455* (2006.01)

(52) U.S. Cl. ........... 703/14; 703/13; 703/15; 703/19; 703/20; 703/21; 703/22; 703/23; 714/34; 714/35; 714/744

(58) Field of Classification Search ............ 703/13–15, 703/17, 19–23, 26; 716/4, 5; 714/34, 35, 714/744
See application file for complete search history.

(56) References Cited

U.S. PATENT DOCUMENTS

| | | | | | |
|---|---|---|---|---|---|
| 5,768,567 A | * | 6/1998 | Klein et al. | ...... | 703/13 |
| 5,771,370 A | * | 6/1998 | Klein | ...... | 703/13 |
| 5,960,181 A | * | 9/1999 | Sanadidi et al. | ...... | 703/21 |
| 5,960,182 A | * | 9/1999 | Matsuoka et al. | ...... | 703/17 |
| 5,987,243 A | * | 11/1999 | Aihara | ...... | 703/17 |
| 6,009,256 A | * | 12/1999 | Tseng et al. | ...... | 703/13 |
| 6,182,247 B1 | * | 1/2001 | Herrmann et al. | ...... | 714/39 |
| 6,212,489 B1 | * | 4/2001 | Klein et al. | ...... | 703/13 |
| 6,230,114 B1 | * | 5/2001 | Hellestrand et al. | ...... | 703/13 |
| 6,263,302 B1 | * | 7/2001 | Hellestrand et al. | ...... | 703/17 |
| 6,356,862 B2 | * | 3/2002 | Bailey | ...... | 703/16 |
| 6,366,530 B1 | * | 4/2002 | Sluiter et al. | ...... | 365/240 |
| 6,389,379 B1 | * | 5/2002 | Lin et al. | ...... | 703/14 |
| 6,389,558 B1 | * | 5/2002 | Herrmann et al. | ...... | 714/39 |
| 6,453,450 B1 | * | 9/2002 | Walter | ...... | 716/102 |
| 6,470,481 B2 | * | 10/2002 | Brouhard et al. | ...... | 716/106 |
| 6,480,954 B2 | * | 11/2002 | Trimberger et al. | ...... | 713/1 |
| 6,570,592 B1 | * | 5/2003 | Sajdak et al. | ...... | 715/769 |
| 6,598,178 B1 | * | 7/2003 | Yee et al. | ...... | 714/34 |
| 6,624,829 B1 | * | 9/2003 | Beck et al. | ...... | 715/771 |
| 6,707,474 B1 | * | 3/2004 | Beck et al. | ...... | 715/771 |
| 6,718,294 B1 | * | 4/2004 | Bortfeld | ...... | 703/20 |
| 6,751,583 B1 | * | 6/2004 | Clarke et al. | ...... | 703/17 |
| 7,085,976 B1 | * | 8/2006 | Shirazi et al. | ...... | 714/725 |
| 7,089,175 B1 | * | 8/2006 | Nemecek et al. | ...... | 703/28 |
| 7,110,935 B1 | | 9/2006 | Hwang et al. | | |
| 7,143,369 B1 | * | 11/2006 | Milne | ...... | 716/102 |
| 7,260,517 B2 | * | 8/2007 | Bailey et al. | ...... | 703/27 |
| 7,287,178 B1 | * | 10/2007 | Milne et al. | ...... | 713/600 |
| 7,346,481 B1 | * | 3/2008 | Ballagh et al. | ...... | 703/14 |
| 7,366,650 B2 | * | 4/2008 | Nightingale et al. | ...... | 703/26 |

(Continued)

OTHER PUBLICATIONS

Matlab/Simulink BSP Manual, pp. 1-177, Oct. 12, 2007.*

*Primary Examiner* — David Silver
*Assistant Examiner* — Kibrom Gebresilassie
(74) *Attorney, Agent, or Firm* — Scott Hewett; LeRoy D. Maunu (57) ABSTRACT

A high-level integrated circuit ("IC") modeling system (400) includes a first co-simulator (418) modeling a first portion of an IC system and a second co-simulator (419) modeling a second portion of the IC system, each co-simulator operating according to initial simulation operating conditions (426). A co-simulation synchronization interface (424) is configured to automatically change at least one of the initial simulation operating conditions to a triggered operating condition (428) in response to a user-selected triggering signal.

11 Claims, 3 Drawing Sheets

U.S. PATENT DOCUMENTS

| | | | |
|---|---|---|---|
| 7,366,651 B1* | 4/2008 | Milne et al. | 703/27 |
| 7,401,333 B2* | 7/2008 | Vandeweerd | 718/102 |
| 7,437,280 B1* | 10/2008 | Ballagh et al. | 703/14 |
| 7,475,288 B2* | 1/2009 | Multhaup et al. | 714/28 |
| 7,478,027 B2* | 1/2009 | Ban | 703/13 |
| 7,539,953 B1* | 5/2009 | Seng et al. | 716/116 |
| 7,574,635 B1* | 8/2009 | Alfke | 714/719 |
| 7,673,265 B2* | 3/2010 | Akiba et al. | 716/106 |
| 7,707,019 B1* | 4/2010 | Ballagh et al. | 703/13 |
| 7,937,259 B1* | 5/2011 | Chan et al. | 703/28 |
| 7,970,597 B2* | 6/2011 | Lin et al. | 703/23 |
| 8,001,409 B2* | 8/2011 | Osborn et al. | 713/400 |
| 8,145,467 B1* | 3/2012 | Ou et al. | 703/15 |
| 2002/0019969 A1* | 2/2002 | Hellestrand et al. | 716/5 |
| 2002/0059054 A1* | 5/2002 | Bade et al. | 703/20 |
| 2002/0120909 A1* | 8/2002 | Brouhard et al. | 716/5 |
| 2003/0105620 A1* | 6/2003 | Bowen | 703/22 |
| 2003/0171908 A1* | 9/2003 | Schilp et al. | 703/16 |
| 2003/0188278 A1* | 10/2003 | Carrie | 716/4 |
| 2004/0181385 A1* | 9/2004 | Milne et al. | 703/14 |
| 2004/0215438 A1* | 10/2004 | Lumpkin et al. | 703/22 |
| 2004/0260528 A1* | 12/2004 | Ballagh et al. | 703/14 |
| 2005/0060133 A1* | 3/2005 | Schuppe | 703/22 |
| 2005/0071602 A1* | 3/2005 | Niell et al. | 712/202 |
| 2006/0224372 A1* | 10/2006 | Ban | 703/13 |
| 2007/0028144 A1* | 2/2007 | Graham et al. | 714/34 |
| 2009/0083682 A1* | 3/2009 | Akiba et al. | 716/5 |
| 2009/0132224 A1* | 5/2009 | Reichor et al. | 703/21 |
| 2010/0077118 A1* | 3/2010 | Blackwell et al. | 710/74 |

* cited by examiner

CO-SIMULATION SYNCHRONIZATION INTERFACE FOR IC MODELING

FIELD OF THE INVENTION

The present invention relates generally to integrated circuits ("ICs"), and more particularly to synchronizing multiple simulators used to model an IC system.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored off-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

The programming used to configure an FPGA or other PLD is often very complex. It is common to use a modeling system to simulate the operation of the programming to evaluate how a physical FPGA will operate when used in a system, such as a system on a chip ("SoC"). In some systems, a PLD interfaces with or includes functional blocks. For example, an FPGA includes an embedded processor operating at a first clock speed, and an I/O interfacing peripheral and a customized computation peripheral (such as a digital processing or image processing filter) operating at a different clock speed. Multiple simulators are integrated into the modeling system to simulate the different functional blocks. In yet other instances, the PLD devices themselves are used in the simulation as emulators. In this case, a portion of a design physically runs on a PLB device while the rest of the design is simulated by the simulators running on a host PC. A modeling system interface controls the simulation progress of the software simulators or emulation hardware, and exchange simulation data between them when needed.

One the one hand, the number of clock cycles used by a functional blocks to process one input data sample may be vastly different. For example, a microprocessor runs an operating system, and requires thousands of clock cycles to manage the operating system services (e.g., interrupt service routines, data transfer to off-chip devices). In comparison, an adder functional block usually just needs one or a few clock cycles to finish the addition/subtraction of one set of data samples.

On the other hand, the different simulators and the emulation hardware may have significant different simulation speeds. For example, the emulation hardware component can simulate tens of millions of clock cycles per second, while a low-level HDL simulator can only simulate a few kilo clock cycles per second.

Considering the above two factors, the times spent by the simulators integrated inside the modeling system to simulate the IC system are often significantly different.

The functional blocks have precedence relations when processing the input data and need to exchange output data with each other. It is required that the simulators that simulate these functional blocks are synchronized properly during co-simulation. One technique is to use single-step clocking co-simulation.

During single-step clocking co-simulation, a global clock pulse is applied to each simulator or emulation hardware after each simulation step. The functional blocks operate off the global clock pulse, which is usually at least as slow as the slowest simulator clock rate in the co-simulation modeling environment. However, due to the different simulation requirements of the functional blocks, and the different simulation speeds of the integrated simulators, this technique unnecessarily slows the simulators/emulation hardware with fast simulation speeds, and the simulation of functional blocks that require significantly more clock cycles than other functional blocks. Single-step clocking is too slow and may even prove to be impractical for many embedded system developments.

SUMMARY OF THE INVENTION

An integrated circuit modeling co-simulation synchronization system for is presented here. The system allows the various components of a co-simulation; the integrated circuit hardware, the functional blocks programmatically configured in the hardware, the hardware simulated in a host computer, the simulated functional blocks configured in the simulated hardware, and other components, to work without being slowed to the pace of the slowest clock speed represented in the simulation.

A high-level integrated circuit ("IC") modeling system includes multiple simulators and/or emulation hardware. Each of the simulators and emulation hardware models a subset of functional blocks that compose of an IC system, and operates according to initial simulation operating conditions. A co-simulation synchronization interface is configured to automatically change at least one of the initial simulation operating conditions to a triggered operating condition in response to a user-identified triggering signal.

DETAILED DESCRIPTION

Figure 1:
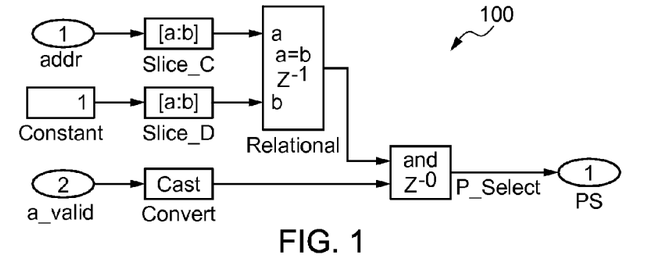
FIG. 1 is a diagram of a portion of a high-level modeling environment with a co-simulation interface according to an embodiment of the invention.

FIG. 1 is a diagram of a portion of a high-level modeling environment (also known as a "high-level modeling system") 100 of a bus decoding circuit sitting between a processor (not shown) and a peripheral (also not shown). When the processor requests a word of data stored at a specific memory location from its peripherals, it broadcasts the address of the memory location to the input port addr of its peripherals. Input port a_valid goes high during the broadcast, indicating to the peripherals that the address value appeared on input port addr is a valid address from the processor. If a peripheral contains the data of the memory address requested by the processor, the output port p_select of the high-level model goes high, which triggers the peripheral to acknowledge the request and send the requested data back to the processor.

As used herein, the term "high-level" means that a modeling environment uses values (data) in a particular format, such as fixed point, floating point, or integer values. When operating in a high-level modeling environment, the users do not have to concern themselves with how the bit values are transmitted or operated upon in the modeling blocks. The translation and propagation between the high-level values of interest to the user and low-level (e.g., bit level or HDL) values handled by the functional blocks are automatic and transparent to the users. Further information on high-level modeling environments is found in commonly owned U.S. Pat. No. 7,110,935, entitled METHOD AND SYSTEM FOR MODELING AND AUTOMATICALLY GENERATING AN ELECTRONIC DESIGN FROM A SYSTEM LEVEL ENVIRONMENT, issued Sep. 19, 2006 to Hwang et al., the disclosure of which is hereby incorporated in its entirety by reference for all purposes.

The user-identified signals (e.g., p_select, opb_addr, sg2fsl_write) are used to describe triggers that automatically change one or more operating conditions of one or more co-simulators in the high-level modeling environment 100. When the values of the user-identified signals satisfy a triggering condition, a triggering signal is sent to the interface 102 to dynamically change the IC system simulation without stopping (pausing) for a real-time user input. The interface 102 changes an operating condition of at least one co-simulator (see, e.g., FIG. 3, ref. nums. 302, 304) in response to the triggering signal. For example, if a user-identified signal makes a user-selected triggering condition satisfy the desired value, a triggering signal is sent to the synchronization interface and a parameter of the IC system simulation, such as the clock speed of a co-simulator, clock speed ratios of co-simulators, or latencies, is automatically changed in a dynamic fashion. That is, after selecting the triggering condition and entering it into the co-simulation synchronization interface, the high-level modeling environment changes conditions without waiting for a user input during the simulation.

Figure 2:
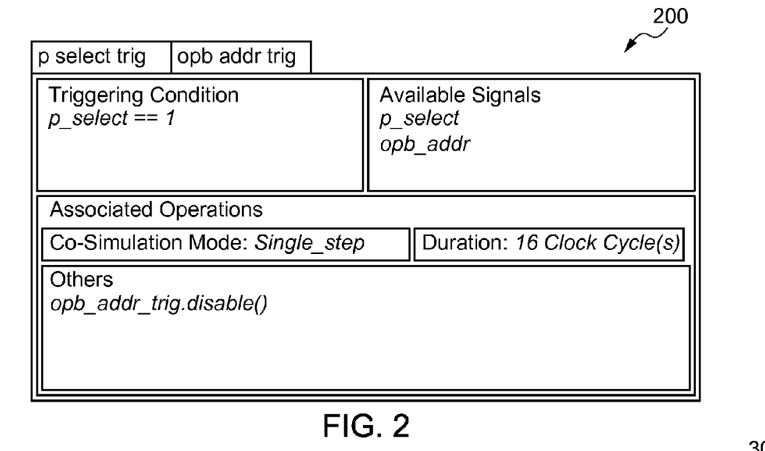
FIG. 2 is an illustration of an embodiment of a co-simulation synchronization interface according to an embodiment of the invention.

FIG. 2 is an illustration of an embodiment of a co-simulation synchronization interface 200 according to an embodiment of the invention. The interface is embodied in a computer, such as a PC or a processor associated with one of the co-simulators or in a hardware implementation (e.g., in a processor configured in an FPGA that is being used as a hardware implementation in the high-level modeling environment). The co-simulation interface 200 is generally a set of computer executable instructions that controls at least two co-simulators in the high-level modeling environment. Generally, a co-simulator models a subset of functional blocks that make up an IC system.

The co-simulators are multiple different simulators that operate concurrently to model an IC system, such as a Virtual Platform simulator used to model a processor and a simulator (e.g., hand-written C simulation models or HDL simulators) integrated with a system-level design tool, such as SYSTEM GENERATOR ("SYSGEN"), which is based on the MATLAB/ SIMULINK modeling environment. SYSGEN used to model a hardware peripheral; or a hardware implementation configured to simulate a portion of the IC design under test used in conjunction with a SYSGEN simulator. Using a hardware implementation for co-simulation allows simulation speed-up and design verification on an actual silicon component. A design that appears to run as expected on a software-only simulator might behave differently when running on the actual hardware, due to effects such as data traversal delay and propagation effects between registers that result in partial data transfers at the end of a clock cycle. Additional co-simulators are used in alternative embodiments. For example, a co-simulation interface according to another embodiment synchronizes more than two software co-simulators, more than two hardware co-simulators, multiple software co-simulators with one or more hardware co-simulators, or multiple hardware co-simulators with one or more software co-simulators.

Additional information on using hardware implementations in co-simulation high-level modeling environment is found in commonly-owned U.S. Pat. No. 7,085,976, entitled METHOD AND APPARATUS FOR HARDWARE CO-SIMULATION CLOCKING, issued Aug. 1, 2006 to Shirazi et al., the disclosure of which is hereby incorporated by reference in its entirety for all purposes.

In a particular embodiment, a computer, such as a PC, controls both a hardware implementation of a modeling element (e.g., an IC configured to provide a portion of the simulation) and software simulating another modeling element. In a specific embodiment, a processor runs at a processor speed (clock rate) and a peripheral, such as an adaptive filter, occasionally exchanges data to and from the processor, such as providing sampled input data to the processor and receiving updated filter coefficients from the processor. The time to simulate the data being processed by peripheral is much less than the time to simulate the data processing on the processor. The simulation speeds of the processor and the peripheral can be determined using well-known bench marking techniques; however, the synchronization between co-simulators is often application specific and changes dynamically during simulation depending on the status of the functional blocks and the input data samples. Embodiments of the invention allow a user to define one or more triggers according to the user's application, which can change the synchronization of the simulators dynamically during simulation.

For example, a user can specify a triggering condition based on one or more selected signals, such as p_select==1 is used to indicate that at a specific simulation cycle, a value appears at output port p_select. When p_select goes HIGH, it indicates that the peripheral contains the data requested by the processor. On each simulation clock cycle of the integrated co-simulators, these triggering conditions are evaluated in their order of appearance in the interface. If a triggering condition is evaluated to be TRUE, it is deemed satisfied (i.e., a triggering signal is generated).

When a triggering condition is satisfied during simulation, a triggering signal is sent to the synchronization interface that performs an associated operation on one or more of the co-simulators. The operations include co-simulation synchronization modes that the high-level modeling environment would enter when the triggering conditions are satisfied, and the duration of the triggering conditions. Other user-defined operations can also be specified through the co-simulation interface. For example, it is possible by associating a triggering condition with operations to enable or disable a subset of triggering conditions so that the synchronization interface can be self-adjusted in some specific simulation context.

During co-simulation IC system modeling, the interface automatically adjusts the synchronization of the co-simulators based on the user-specified triggering conditions and the associated operations. When a triggering condition is satisfied, the associated operation is performed, which puts the high-level modeling environment into a specific co-simulation mode, or enables/disables the triggering condition(s), or perform some operations specified by the users. If no triggering condition is satisfied or if the conditions that are triggered time out, the interface typically brings the co-simulators into a default co-simulation synchronization mode.

For example, if the default condition is that for a specific amount of actual execution time of an IC system, the time to simulate the data processing on a processor is 500 times longer than that of a peripheral being co-simulated, the default clocking ratio is 500:1. The simulator of the processor is synchronized to the simulator of the peripheral at this default clocking ratio if the processor and the peripheral do not need to communicate with each other. A co-simulation interface controls the clocking of the processor and the peripheral, either directly by generating clock signals, or coupling an external clock source(s) to the elements being modeled, or by controlling an on-chip clock circuit in a hardware implementation of the IC system being modeled. If a triggering condition is satisfied, such as a p_select==1 being sent to the interface, the interface places both the processor and the peripheral into a single-step clocking mode, the co-simulation mode associated with this triggering condition. That is, both the processor and the peripheral advance one operation on each clock cycle (i.e., a co-simulator clock ratio of 1:1). Conventional modeling systems using transactional modeling lose clock cycle accountability, which can lead to inaccuracies when correlating test data (test vector) input to test data output, and hence inaccurate output if data boundary transfer modeling becomes inaccurate. In comparison, using the co-simulation interface, the data boundary transfer is modeled on a cycle-accurate basis. Users can observe whether the hand-shaking protocols between different functional blocks are properly implemented so that the data is able to transfer between them. The single-step clocking mode is maintained for a number of clock cycles as specified by the duration associated with the triggering condition or until the appearance of another triggering signal indicating the end of the triggering is received. Then, the interface returns the co-simulators to the default 500:1 clock ratio, or another co-simulation state specified by the new triggered condition.

In FIG. 2, the interface 200 is defined so that users can add the lines of interest in the high-level model into the co-simulation interface as signals, specify triggering conditions using signals, and associate co-simulation modes and operations with the triggering conditions.

Based on the above triggers and triggering conditions, corresponding triggers are pushed into the underlining software simulators and hardware co-simulation platforms.

During simulation, the interface automatically synchronizes the simulators based on these user-specified triggering conditions and the associated operations. When a triggering condition is satisfied, the associated operation is performed, which turns the simulation into a specific co-simulation mode, and/or enables/disables the triggering conditions. Note that if none of the triggering conditions is satisfied or if the triggering period has been met, the proposed interface brings the integrated co-simulators into a default co-simulation synchronization mode, which in a particular embodiment is a free running mode.

Figure 3:
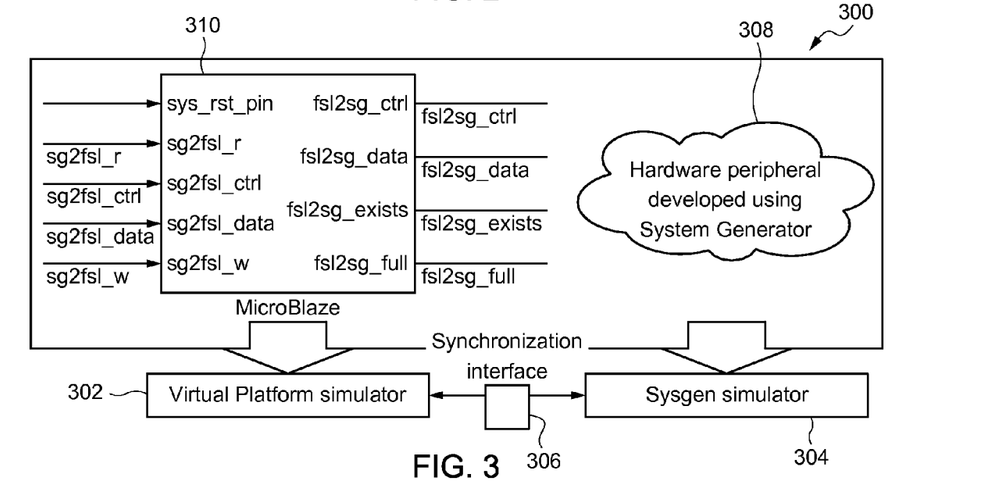
FIG. 3 is a diagram of a high-level modeling environment with two different co-simulators according to another embodiment.

FIG. 3 is a diagram of a high-level modeling environment 300 with two different co-simulators 302, 304 according to another embodiment. A co-simulation synchronization interface 306 can increase the speed and performance profiling of the high-level modeling environment 300. In a particular example, the first co-simulator models a MICROBLAZE™ processor that communicates with a peripheral 308 through a pair of FIFO-based fast simplex links ("FSLs") (not separately shown. MICROBLAZE is a soft processor realized using the on-chip FPGA resources. It is available on most of Xilinx FPGAs, including VIRTEX-II PRO, VIRTEX-4, VIRTEX-5, and SPARTAN-3 FPGA devices available from XILINX, INC. of San Jose, Calif. The MICROBLAZE processor and the FSLs are simulated using a VIRTUAL PLATFORM simulator provided by EMBEDDED DEVELOPMENT TOOL ("EDK"), while the peripheral is developed and simulated using SYSGEN. The interface 306 is used to synchronize the simulation processes in the VIRTUAL PLATFORM simulator 302 and the SYSGEN simulator 304.

Three lines coming out of the MICROBLAZE block 310 in MATLAB/SIMULINK, which are part of the pair of FSLs, are selected into the synchronization interface 302 as signals: fsl2sg_exists, sg2fsl_read, and sg2fsl_write. When no triggering condition is active, the default co-simulation mode specifies that, on each SIMULINK simulation cycle, the VIRTUAL PLATFORM simulator runs for 500 clock cycles while the SYSGEN simulator runs for one clock cycle. The VIRTUAL PLATFORM is integrated into MATLAB/SIMULINK and is not directly visible to the end-user. The lines coming in and out the MICROBLAZE block are the interface between the VIRTUAL PLATFORM simulator and MATLAB/SIMULINK. The default 500:1 simulation speed ratio is determined from two facts: the VIRTUAL PLATFORM simulator runs much faster than the SYSGEN simulator, and the software execution simulated by the VIRTUAL PLATFORM simulator usually runs more clock cycles than the hardware execution simulated by the SYSGEN simulator. Three triggering conditions are defined by the users using the selected signals, which are slave_exists_trig, slave_read_trig, master_write_trig. Triggering condition fsl2sg_exists==1 indicates that the simulated MICROBLAZE processor 310 has data to send to the simulated peripheral 308.

Triggering condition sg2sl_read==1 indicates that the simulated peripheral acknowledges the successful acceptance of one word of data from the simulated MICROBLAZE processor. The user-selected duration of this triggering condition is 3 clock cycles because a MICROBLAZE processor requires three clock cycles to check the status of a slave FSL and absorb the acknowledgement.

Triggering condition sg2sl_write==1 indicates that the simulated peripheral has data to send to the simulated MICRO-BLAZE processor. When any of these three triggering conditions is satisfied, the SIMULINK and VIRTUAL PLATFORM simulator 302 enters single-step co-simulation mode. That is, on each simulation cycle, both the VIRTUAL PLATFORM simulator and the SYSGEN simulator run for one clock cycle. The triggering conditions and their associated operations are summarized in Table 1, below:

TABLE 1

| Trigger name | Triggering condition | Co-simulation mode | Duration |
|---|---|---|---|
| slave_exists_trig | fsl2sg_exists == 1 | single-step | 1 |
| slave_read_trig | sg2fsl_read == 1 | single-step | 3 |
| master_write_trig | sg2fsl_write == 1 | single-step | 1 |
| Default | | 500:1 | 1 |

With the above triggering conditions and associated operations, the synchronization interface 306 allows the VIRTUAL PLATFORM simulator and SYSGEN simulator to run at optimized simulation speeds when the MICROBLAZE processor and its FSL peripheral do not communicate with each other. On the other hand, when the MICROBLAZE processor and its FSL peripheral need to communicate with each other, the synchronization interface 306 brings the high-level modeling environment 300 into single-step co-simulation mode. This ensures that the data is able to transmit from one component to the other component through the pair of FSLs while maintaining clock cycle accountability and accuracy. In other words, the user can examine how many clock cycles occurred to complete the data transfer from the MICROBLAZE processor to the peripheral or vice versa.

Note that while the data can transmit from one component to the other component using the above triggering conditions, the data appears at different times in a cycle-accurate simulation. So, the users need to implement some hand-shaking mechanisms to ensure that the data can be properly accepted the other components.

Consider a design in which a MICROBLAZE processor communicates with a slave On-chip Peripheral Bus ("OPB") peripheral. Similar to the example discussed above, the MICROBLAZE processor is simulated using the VIRTUAL PLATFORM simulator, while the slave OPB peripheral is developed and simulated using a SYSGEN simulator. The synchronization interface is used to synchronize the simulation progress of the VIRTUAL PLATFORM simulator and SYSGEN simulator.

As shown in FIG. 3, the OPB bus decoding of the peripheral is implemented in the SYSGEN simulator. Similar to the example above, the default co-simulation mode is set to a 500:1 simulation speed ratio between the VIRTUAL PLATFORM simulator and the SYSGEN simulator. When the simulated MICROBLAZE processor requests to send data to the slave OPB peripheral, p_select becomes 1. Then, the slave OPB peripheral needs to acknowledge the request from the MICROBLAZE processor within 16 clock cycles. Otherwise, the simulated MICROBLAZE processor would raise a time-out exception, reporting the inaccessibility of the slave OPB peripheral to the user program.

The opb_select is selected into the proposed interface and is used to create triggering condition opb_selectr_trig. When opb_select==1, the synchronization interface brings both the VIRTUAL PLATFORM simulator and the SYSGEN simulator into single-step co-simulation mode. The simulation interface keeps the single-step co-simulation mode for the next 16 clock cycles, allowing the slave OPB to respond to the request from the simulated MICROBLAZE processor in time. The triggering conditions and operations are shown in Table 2, below:

TABLE 2

| Trigger name | Triggering condition | Co-simulation mode | Duration |
|---|---|---|---|
| opb_select_trig | opb_select == 1 | single-step | 16 |
| Default | | 500:1 | 1 |

In many cases, the software development on embedded processors requires running an operating system. While the operating systems have hundreds of thousands of execution clock cycles, the co-processing in the peripheral developed in the SYSGEN simulator usually only needs a few clock cycles. Allowing the processor to run at its maximum speed when it is not interacting with the peripheral modeled in the SYSGEN simulator can significantly speed up the overall simulation process of the IC system.

The embedded processor may read data from the SYSGEN simulator at some specific code regions (e.g., interrupt service routines). The users can have little or no knowledge of the communication interfaces between the processors and their peripherals, and thus are unable to set up the triggering conditions as described in the previous two design scenarios. Under this circumstance, a user can set up triggering conditions to bring the overall simulation into single-step mode whenever the processors enter the code regions that are related to the communications with associated peripherals developed in SYSGEN.

For example, the MICROBLAZE processor has a port called pc_ex, which outputs the value of program counter (PC) register on each clock cycle. Users can select this port to communicate with the synchronization interface as signal pc_ex and create the triggering condition shown below in Table 3 to bring the co-simulation into single-step co-simulation which the simulated MICROBLAZE processor enters the code regions that communicate with the SYSGEN-modeled peripherals. For example, the following pc_ex_trig triggering condition identifies two code regions between addr1 and addr2, and between addr3 and addr4.

TABLE 3

| Trigger name | Triggering condition | Co-simulation mode | Duration |
|---|---|---|---|
| pc_ex_trig | (addr1 << pc_ex << addr2) && (addr3 << pc_ex << addre4) | single-step | 1 |
| default | | 500:1 | 1 |

Figure 4:
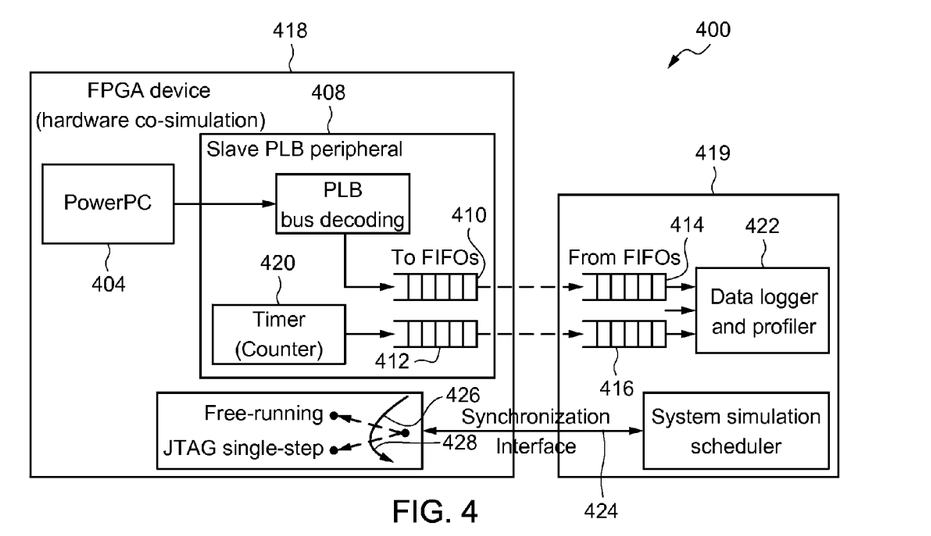
FIG. 4 is a diagram of a high-level modeling environment with an on-chip peripheral bus according to another embodiment.

FIG. 4 is a diagram of a high-level modeling environment 400 according to another embodiment. In this embodiment, a POWERPC processor system 404 is constructed using the EDK tool is imported into a SYSGEN simulator as a POWERPC modeling block. A slave processor local bus ("PLB") peripheral 408 is developed in the SYSGEN simulator and consists of a timer 420 and two TO FIFO blocks 410, 412, which are half portions of two shared FIFOs between the FPGA device 418 and a host PC 419. In particular embodiments, the FPGA device 418 is a VIRTEX-II PRO, VIRTEX-4, VIRTEX-5, OR SPARTAN-3 FPGA devices, available from XILINX, INC., of San Jose, Calif.

There are two corresponding FROM FIFO blocks 414, 416 that accept data from the TO FIFO blocks 410, 412. The POWERPC processor system 404 sends profiling data to one of the TO FIFO blocks, e.g., TO FIFO 410. At the same time, the timer 420 pushes the current time into the other TO FIFO block 412. By doing so, the occurrence times of the events of interest are recorded in the pair of shared FIFOs 410, 412. FIFO 410 and FIFO 414 form a shared FIFO. FIFO 410 is implemented on a FPGA device while FIFO 414 is implemented on a PC. All the data stored in FIFO 410 will be automatically moved to FIFO 414. Users retrieve the data pushed into FIFO 410 from FIFO 414. A similar case applies for FIFO 412 and FIFO 416. The profiling data is pushed into FIFO 410 and FIFO 412.

For example, when the POWERPC processor system 404 enters and leaves an interrupt service routine, two specific event codes and their occurrence times are pushed into the TO FIFO blocks 410, 412. One or both of the event codes could be used as a pre-selected triggering signal that the synchronization interface 424 uses to automatically change an initial simulation operating condition (e.g., from a free-running clocking condition 426 of the FPGA device 418) to a triggered simulation operating condition (e.g., to a JTAG single-step clocking condition 428 of the FPGA device 418). A second pre-selected triggering signal is optionally used to indicate to the synchronization interface to put the FPGA device back into free-running clocking mode, or the synchronization interface puts the FPGA device back into free-running clocking mode after a pre-selected duration of time or number of steps.

These data would be further transmitted to the pair of FROM FIFO blocks 414, 416 and finally arrive at the data logger and profiler modeling block 422 running on the host PC processor system 419. From the data logger and profiling block 422, users can obtain profiling information about the POWERPC processor 404, such as how much time is spent on serving a specific interrupt service routine, and how often a specific function is called by the operating systems.

A triggering condition fifo_nonempty_trig, shown in the Table 4, below, is created in the proposed interface. When the user uses the SYSGEN hardware co-simulation capability to simulate the POWERPC processor system and the slave PLB profiling peripheral on an FPGA device, the proposed interface will also generate the clock switching circuits, which, based on the fifo_nonempty_trig triggering condition, can switch the simulation in hardware between different co-simulation modes (e.g., the free-running mode and single-step mode discussed in association with FIG. 4). The following triggering condition is set up for this design case.

TABLE 4

| Trigger name | Triggering condition | Co-simulation mode | Duration |
| --- | --- | --- | --- |
| fifo_nonempty_trig | fifo_empty == 0 | single-step | 1 |
| Default | | free-running | 1 |

The major advantage of the above profiling scheme is that the profiling data can be transmitted from the FPGA device to the host PC 419 using a simple triggering condition. Only two small FIFOs are required on the FPGA device 418 while a large amount of profiling data is stored using the abundant memory available on the host PC 419. The amount of data that can be recorded and stored by the profiling system is not constrained by the limited on-chip and off-chip memory on the FPGA device 418.

One limitation of the above technique is that it would affect the functioning of hardware peripherals, which can be sensitive to clock switching and single-stepping. Examples of such peripherals include the serial universal asynchronous receiver/transmitter ("UART") peripherals. Such problems are avoided by ensuring that the FPGA device runs with a free-running clock (i.e., the half portions of the shared FIFOs on hardware do not contain any profiling data) when these peripherals are in operation. This can be accomplished by checking the status of the shared FIFO and ensuring that the pair of shared FIFOs is empty before interacting with these hardware peripherals.

Figure 5:
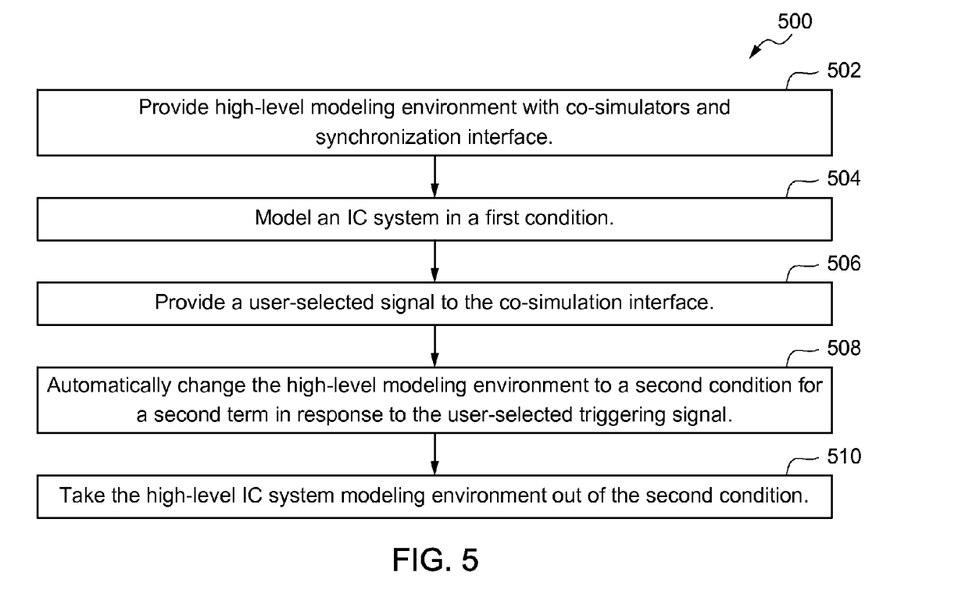
FIG. 5 is a flow chart of a method according to an embodiment of the invention.

FIG. 5 is a flow chart of a method of simulating an IC system 500 according to an embodiment of the invention. A high-level IC system modeling environment having a first co-simulator with a first simulation operating condition, such as a first default clocking speed and a second co-simulator with a second simulation operating condition, such as a second default clocking speed, the first default clocking speed divided by the second default clocking speed producing a default clocking speed ratio, and a co-simulation synchronization interface coupled to each of the first co-simulator and the second co-simulator is provided (step 502). In a particular embodiment, the first co-simulator is a first virtual simulator (e.g., a VIRTUAL PLATFORM simulator) modeling a first portion of the IC system (i.e., a first subset of functional blocks of the IC system) and the second co-simulator is a second virtual simulator (e.g., a SYSGEN simulator) modeling a second portion of the IC system (second subset of functional blocks of the IC system). In an alternative embodiment, one of the first and second co-simulators is a hardware implementation (e.g., a processor). In a particular embodiment, the IC system being modeled is an IC system intended to be configured in an FPGA device and the hardware implementation is one or more functional blocks of a physical sample of the FPGA device.

The co-simulation interface automatically changes (i.e., dynamically controls) at least one of the first simulation operating condition and the second simulation operating condition, such as simulator clocking speed or clocking mode (e.g., free-running or single-step) of at least one co-simulator in response to a user-selected signal in the high-level IC system modeling environment and changes the initial simulation operating to a triggered operating condition in response to a user-selected triggering signal. In the case of hardware co-simulation, the co-simulation interface also changes the co-simulation interface between the PLD and the host PC through techniques such as dynamic partial reconfiguration. The high-level IC system modeling environment uses the first co-simulator and the second co-simulator to model the IC system in a first condition (step 504). In a particular embodiment, the first co-simulator is running at the first default clocking speed and the second co-simulator is running at the second default clocking speed.

A user-selected signal is provided as a triggering condition to the co-simulation interface (step 506) and the co-simulation interface automatically changes the high-level IC system modeling environment to a second condition ("triggered operating condition") for a selected term (508). In a particular embodiment, the co-simulation interface changes a clocking speed of at least one of the first co-simulator and the second co-simulator. In another embodiment, the co-simulation interface changes the first and second co-simulators from free-running clocking modes to a single-step clocking mode.

After the selected term, the co-simulation interface takes the high-level IC system modeling environment out of the second condition (step 510). In a particular embodiment, the selected term is defined by a user-specified limit, such as a number of clock cycles. In an alternative embodiment, the selected term is defined by a second user-selected trigger, such as a flag indicating a full buffer, bus availability, or the execution of a processor running into a code region of interest, etc. In a particular embodiment, the co-simulation interface re-establishes the first condition of the high-level IC system modeling environment after completion of a selected term or duration.

In a further embodiment using a hardware implementation as a co-simulator in the high-level IC system modeling environment, the performance of the hardware implementation is profiled using a triggering signal provided to the co-simulator interface and data capture. In a particular further embodiment, an FPGA device is a hardware co-simulator. A triggering signal, such as a buffer status flag, is provided to the co-simulation interface, which switches the FPGA device from a free-running clocking condition to a single-step clocking condition, and simulates for one clock cycle. Each occurrence of the triggering condition is logged on a FIFO buffer of the FPGA device and transferred to a data logger and profiler running on a computer. In a particular embodiment, the co-simulation interface includes both the customized hardware synchronization circuits and the software programs running on the computer.

Figure 6:
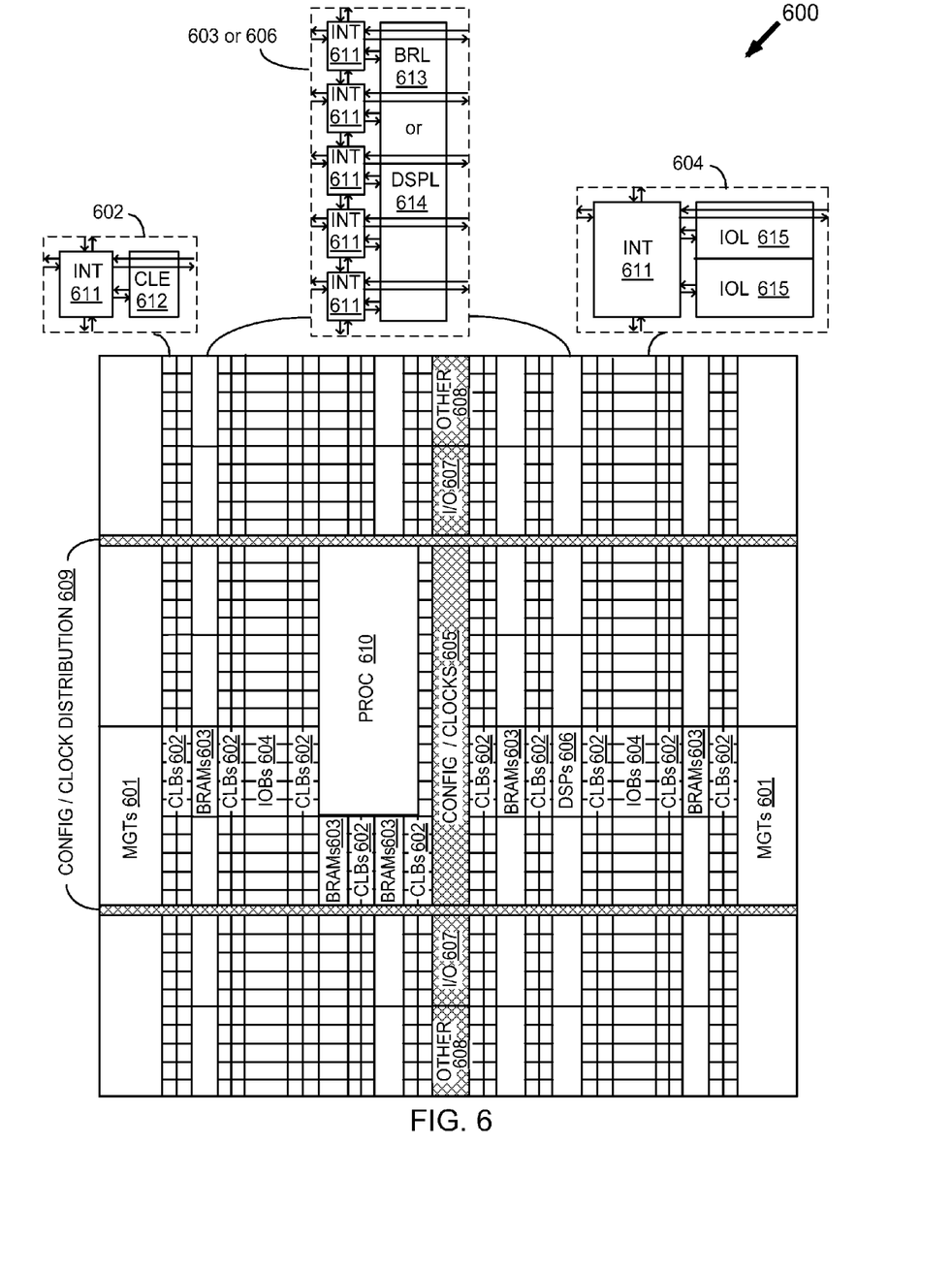
FIG. 6 is a plan view of an FPGA modeled according to an embodiment.

FIG. 6 is a plan view of an FPGA 600 modeled according to an embodiment. The FPGA includes CMOS portions in several of the functional blocks, such as in RAM and logic, and is fabricated using a CMOS fabrication process. The FPGA 600 is configured to a selected application according to modeling information obtained from a high-level IC system modeling environment using co-simulators controlled by a co-simulation interface according to an embodiment. In a particular embodiment, the FPGA 600 was modeled using a second FPGA (not shown) having a functional block the same as or similar to a function block of the FPGA 600 as emulation hardware (i.e., as a co-simulator) in the high-level IC system modeling environment.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, although specific embodiments are described in terms of specific co-simulators and physical implementations of co-simulation interfaces, alternative embodiments apply. Therefore, the spirit and scope of the appended claims should not be limited to the foregoing description.

What is claimed is:

1. A high-level integrated circuit ("IC") modeling system comprising:
    a first co-simulator modeling a first portion of an IC system at a first free running clock speed;
    wherein the first co-simulator executes on a host computer;
    a second co-simulator modeling a second portion of the IC system according to a second free running clock speed;
    wherein the second co-simulator emulates the second portion of the IC system on a programmable integrated circuit (IC);
    a shared first-in-first-out ("FIFO") buffer, a first portion of the shared FIFO buffer being configured in the programmable IC and a second portion of the shared FIFO buffer being configured in the host computer;
    a co-simulation synchronization interface configured to automatically change at least one of the first free running clock speed and the second free running clock speed to a single-step mode in response to a user-selected trigger condition;
    wherein the co-simulation synchronization interface includes an interface for user specification of names of one or more signals of the IC system, of the trigger condition based on the names of the one or more signals and one or more logical operators, and of a duration that is a selected number of clock cycles and associated with the trigger condition; and
    wherein the co-simulation synchronization interface is further configured to return at least one of the first co-simulator or the second co-simulator from the single-step mode to the first free running clock speed or to the second free running clock speed, respectively, in response to operating in the single-step mode for the selected number of clock cycles.

2. The high-level IC modeling system of claim 1 wherein the one or more signals include at least one of a signal in response to a bus condition of the IC system, a buffer status, a processor data export signal wherein one of the first portion of the IC system or the second portion of the IC system is a processor, or a peripheral status signal wherein one of the first portion of the IC system or the second portion of the IC system is a peripheral.

3. The high-level IC modeling system of claim 1 wherein at least one of the first co-simulator or the second co-simulator is a hardware implementation.

4. The high-level IC modeling system of claim 3 wherein the IC system is a field-programmable gate array ("FPGA") system, and the hardware implementation comprises an FPGA IC configured to provide the hardware implementation.

5. The high-level IC modeling system of claim 1, wherein the co-simulation synchronization interface is further configured to return from the single-step mode to the first free running clock speed and the second free running clock speed in response to a second user-specified trigger condition that is based on one or more user-specified signals of the IC system.

6. The high-level IC modeling system of claim 1 wherein the programmable IC is a field-programmable gate array ("FPGA") device.

7. The high-level IC modeling system of claim 6 further comprising:
   a second shared FIFO buffer, a first portion of the second shared FIFO buffer being configured in the FPGA device and a second portion of the second shared FIFO buffer being configured in the host computer;
   a processor configured in the FPGA device; and
   a processor local bus peripheral configured in the FPGA device controlled by the processor having a timer coupled to the first portion of the second shared FIFO buffer.

8. A method of simulating an IC system comprising:
   providing a co-simulation synchronization interface configured to control a first free running clock speed of a first co-simulator of a high-level IC system modeling environment and a second free running clock speed of a second co-simulator of the high-level IC system modeling environment;
   executing the first co-simulator on a host computer, and executing the second co-simulator on a programmable integrated circuit (IC);
   wherein the co-simulation synchronization interface includes an interface for user specification of names of one or more signals of the IC system, of a trigger condition based on the names of one or more signals and one or more logical operators, and of a duration that is a selected number of clock cycles and associated with the trigger condition;
   modeling a first portion of the IC system on the first co-simulator at the first free running clock speed while concurrently modeling a second portion of the IC system on the second co-simulator at the second free running clock speed;
   sending profiling data from the first co-simulator to a first portion of a shared first-in-first-out ("FIFO") buffer configured in the programmable IC, and moving the profiling data from the first portion of the shared FIFO buffer to a second portion of the shared FIFO buffer that is configured in the host computer;
   providing a trigger signal to the co-simulation synchronization interface in response to the one or more signals satisfying the trigger condition to automatically change the first free running clock speed and the second free running clock speed to a single-step mode for the user specified duration;
   wherein the trigger signal is provided to the co-simulation synchronization interface while modeling the first and second portions of the IC system; and
   automatically returning the first co-simulator to the first free running clock speed and the second co-simulator to the second free running clock speed in response to operating in the single-step mode for the selected number of clock cycles.

9. The method of claim 8 wherein the co-simulation synchronization interface includes an interface for user specification of a first clock speed of the first co-simulator and a clock speed ratio of the first clock speed and a second clock speed of the second co-simulator.

10. The method of claim 8 further comprising a step, after providing the trigger signal and before automatically returning the first co-simulator to the first free running clock speed and the second co-simulator to the second free running clock speed, of providing a second trigger signal to the co-simulation synchronization interface in response to a second condition that is based on one or more user-specified signals of the IC system.

11. The method of claim 8 wherein the first co-simulator is configured on a host computer and the second co-simulator comprises a field-programmable gate array ("FPGA") device configured to include a processor and a processor local bus peripheral including a timer, and further comprising recording time information of the trigger signal.

* * * * *